United States Patent
Peterson et al.

(10) Patent No.: US 9,620,265 B2
(45) Date of Patent: Apr. 11, 2017

(54) SEALED HEADER ASSEMBLY

(71) Applicant: TYCO ELECTRONICS CORPORATION, Berwyn, PA (US)

(72) Inventors: Kevin John Peterson, Kernersville, NC (US); Kenneth Wade Long, Jr., Walnut Cove, NC (US); William John Remaley, East Bend, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 14/966,500

(22) Filed: Dec. 11, 2015

(65) Prior Publication Data

US 2016/0211057 A1    Jul. 21, 2016

Related U.S. Application Data

(60) Provisional application No. 62/105,873, filed on Jan. 21, 2015.

(51) Int. Cl.
*H01B 17/30* (2006.01)
*B60R 16/02* (2006.01)
*H02G 3/08* (2006.01)
*H05K 5/06* (2006.01)
*H05K 5/02* (2006.01)
*H02G 15/013* (2006.01)

(52) U.S. Cl.
CPC ......... *H01B 17/30* (2013.01); *B60R 16/0222* (2013.01); *H02G 3/083* (2013.01); *H02G 3/088* (2013.01); *H05K 5/0247* (2013.01); *H05K 5/069* (2013.01); *H02G 15/013* (2013.01)

(58) Field of Classification Search
CPC .......... H01B 17/30; H02G 3/08; H02G 3/081; H02G 3/088; H02G 3/083; H02G 3/086; H02G 3/14; H01R 13/5202; H01R 13/5213; H01R 13/5208; H01R 13/5205; H01R 13/521; H05K 5/069
USPC ............................................ 174/50.52, 50.53
See application file for complete search history.

(56) References Cited

U.S. PATENT DOCUMENTS

| 6,595,789 | B2 * | 7/2003 | Oota ................. | H01R 13/5205 174/359 |
| 2004/0016079 | A1 * | 1/2004 | Kameyama ......... | B60R 16/0222 16/2.1 |
| 2005/0139372 | A1 | 6/2005 | Matsui et al. | |

(Continued)

FOREIGN PATENT DOCUMENTS

| CN | 102 765 358 A | 11/2012 |
| DE | 199 00 685 A1 | 9/1999 |

(Continued)

OTHER PUBLICATIONS

European Search Report, Mail Date Jun. 1, 2016, EP 16 15 1835, Application No. 16151835.2-1503.

*Primary Examiner* — Hoa C Nguyen
*Assistant Examiner* — Amol Patel

(57) ABSTRACT

A sealed header assembly includes a housing having a cover shroud portion, a mounting portion, and a wire holder portion. The sealed header assembly includes a wire cover removably mounted to the housing. A seal is held within the housing by a seal cap. The housing and wire cover include wire guidance features for providing a path for the wire to exit the housing.

20 Claims, 6 Drawing Sheets

(56) References Cited

U.S. PATENT DOCUMENTS

| | | | |
|---|---|---|---|
| 2009/0133925 A1* | 5/2009 | Albert | B60R 16/0222 174/72 A |
| 2011/0287636 A1 | 11/2011 | Zwickler | |
| 2012/0024876 A1 | 2/2012 | Geer et al. | |
| 2012/0270444 A1* | 10/2012 | Kawamura | H01R 9/032 439/607.44 |
| 2013/0168150 A1* | 7/2013 | Sakakura | H02G 3/22 174/650 |
| 2013/0196537 A1* | 8/2013 | Klein | H01R 13/62 439/563 |
| 2014/0027154 A1* | 1/2014 | Imahori | H01B 9/006 174/135 |
| 2014/0030902 A1* | 1/2014 | Baudelocque | H01R 13/5205 439/271 |
| 2015/0325947 A1* | 11/2015 | Wang | H01R 13/5202 277/616 |
| 2015/0364856 A1* | 12/2015 | Nakai | H01R 13/6581 439/587 |
| 2015/0372466 A1* | 12/2015 | Tamai | H05K 5/0247 174/50.52 |

FOREIGN PATENT DOCUMENTS

| | | |
|---|---|---|
| DE | 199 46 357 A1 | 3/2001 |
| DE | 10 2011 113 032 A1 | 3/2013 |
| EP | 2 055 535 A1 | 5/2009 |
| EP | 2 592 701 A1 | 5/2013 |
| FR | 1 076 698 A | 10/1954 |
| GB | 2 348 746 A | 10/2000 |
| GB | 2 390 233 A | 12/2003 |

* cited by examiner

SEALED HEADER ASSEMBLY

CROSS REFERENCE TO RELATED APPLICATIONS

This application claims the benefit of U.S. Provisional Application No. 62/105,873 filed Jan. 21, 2015 titled SEALED HEADER ASSEMBLY, the subject matter of which is herein incorporated by reference in its entirety.

BACKGROUND OF THE INVENTION

The subject matter herein relates generally to sealed header assembly and more specifically a sealed pass-through header assembly.

Header assemblies are used to provide an electrical conductive path through a structure. For example, the structure may be a panel or cover for an electrical device, and the pass-through header assembly may extend through a defined opening in the structure to provide a path for electrical components interior of the device to electrically connect to electrical components exterior of the device. Some known headers assemblies are configured to be mounted to a case or housing, such as a housing of an electrical and/or mechanical device. Some known pass-through headers are mounted to a housing of an electrical device and also extend at least partially through a panel that is placed over the device. In an example application in the automotive industry, the pass-through header may be installed through a transmission cover to provide electrical power, control, and/or data signals to and/or from the transmission.

Known pass-through header assemblies pass through the opening in the panel such that a first portion of the header assembly is on a first side of the panel and a second portion of the header assembly is on an opposite second side of the panel. The first portion of the header assembly may be configured to interface with a mating connector. The second portion of the header on the other side of the panel may be electrically connected to electrical components of the electrical device. The header assembly includes a mating interface with contacts configured to be mated with an external mating connector, also including contacts. A problem with pass-through header assemblies is that leak paths that allow the unintentional transfer of pressure, gases, liquids, and contaminants into and out of the device may form from both the opening in the panel and though the header assembly, which could harm the performance of the device.

Known pass-through header assemblies use a peripheral seal located at the interface between the panel and the header assembly in order to seal the header assembly to the panel at the opening. Known pass-through header assemblies are also potted or use an overmolded grommet to allow the wires to pass from inside the transmission into the header assembly while preventing contaminants from passing into the electrical device from the transmission. The header assembly and the mating connector may also provide sealing at the interface between the two connectors and may provide sealing for each individual contact. The potting, grommets and seals may prevent air, liquid, and/or debris from leaking through the opening of the panel around or through the header assembly. However, use of such sealing materials may be complex to design and manufacture, increasing the cost of the system. Additionally, providing multiple connectors adds cost to the overall system.

A need remains for a sealed header assembly that allows electrical signal paths to pass through the device without the use of potting or overmolded grommets.

BRIEF DESCRIPTION OF THE INVENTION

In one embodiment, a sealed header assembly is provided including a housing having a cover shroud portion, a mounting portion and a wire holder portion. The mounting portion is configured to mount the housing to a case of an electrical device. The wire holder portion is configured to extend through an opening in the electrical device to an interior of the electrical device. The wire holder portion is configured to receive wires passing through the housing between the interior and an exterior of the electrical device. The wire holder portion includes a chamber bounded by chamber walls. The wire holder portion has a plurality of wire channels through one of the chamber walls being open to the chamber and to the cover shroud portion on opposite sides of the chamber wall. An exterior of the wire holder portion has a seal configured to be sealed to the case of the electrical device. The sealed header assembly includes a wire cover removably mounted to the housing at the cover shroud portion to define a wire passageway for the wires. The sealed header assembly includes a seal received in the chamber and being sealed to at least one of the chamber walls. The seal has a plurality of wire channels and is configured to seal against the wires received in the corresponding wire channels. The sealed header assembly includes a seal cap received in the chamber to hold the seal in the chamber. The seal cap includes a plurality of wire channels receiving corresponding wires.

In another embodiment, a sealed header assembly is provided including a housing having a cover shroud portion, a mounting portion and a wire holder portion. The mounting portion configured to mount the housing to a case of an electrical device. The wire holder portion configured to extend through and seal to an opening in the electrical device to an interior of the electrical device. The wire holder portion has a seal configured to receive and seal wires passing through the housing between the interior and an exterior of the electrical device. The wire holder portion has wire channels receiving the wires and extending along channel axes. The cover shroud portion has a bottom surface and shroud walls extending from the bottom surface to a top edge. The sealed header assembly includes a wire cover removably mounted to the housing at the top edge of the cover shroud portion to define a wire passageway for the wires between the bottom surface and the wire cover. The cover directs the wires through the wire passageway between a wire port and the wire channels in a direction generally perpendicular to the channel axes.

DETAILED DESCRIPTION OF THE INVENTION

Figure 1:
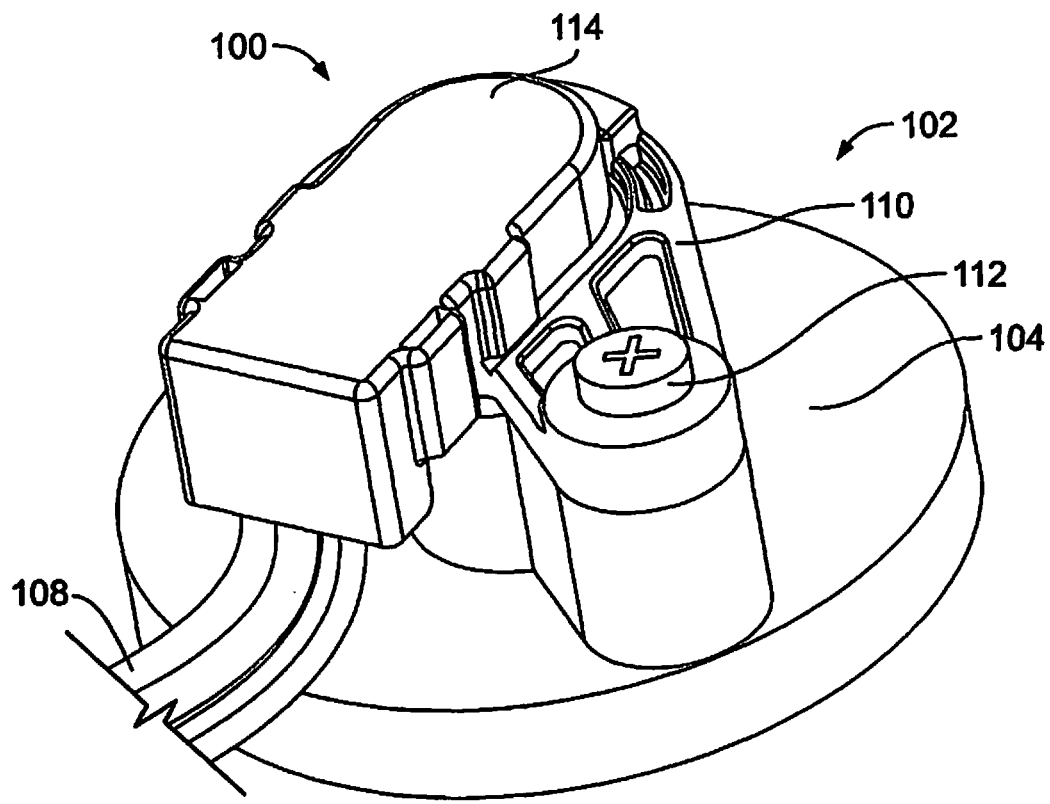
FIG. 1 is a perspective top view of a sealed header assembly formed in accordance with an exemplary embodiment mounted to a device.
Figure 2:
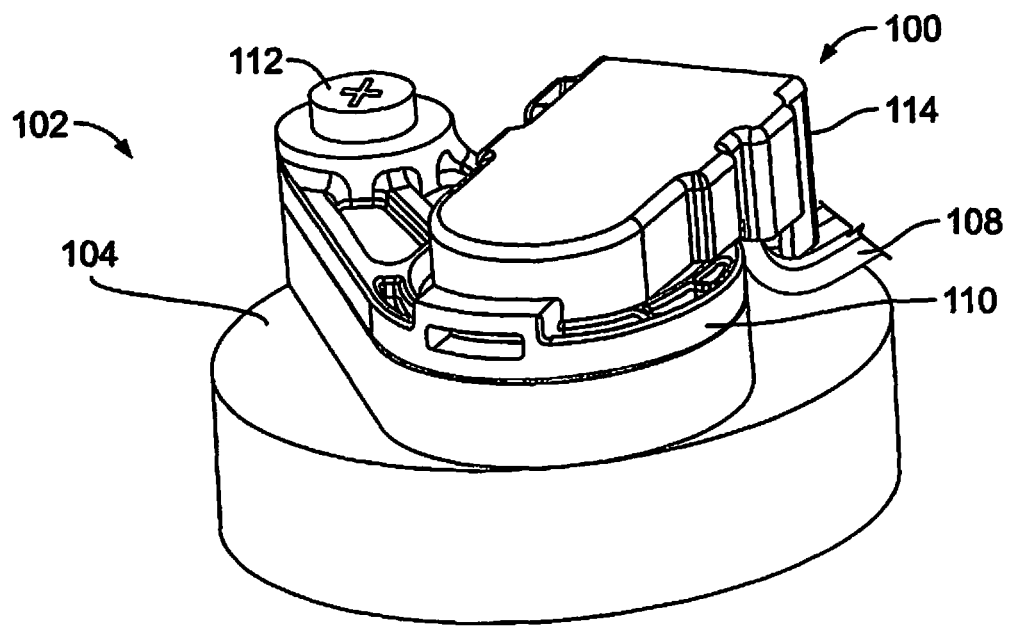
FIG. 2 is a perspective top view of the sealed header assembly shown in FIG. 1.

FIGS. 1 and 2 are perspective top views of a sealed header assembly 100 formed in accordance with an exemplary embodiment. The header assembly 100 is shown mounted to an electrical device 102. In one or more embodiments, the header assembly 100 may be mounted to a case 104 of the device 102. For example, the case 104 may be a panel, structural component, cover or the like of the device 102. The case 104 may include an opening 106 (shown in FIG. 6) that receives a portion of the sealed header assembly 100, such as to allow wires 108 to pass therethrough between an interior and an exterior of the case 104 or device 102. The device 102 may be any type of electrical device having a wire pass through, such as a motor, an engine, a transmission, a computer, a sensor, and/or the like. In an embodiment, the device 102 may be an automotive device. For example, the device 102 may be a transmission, and the case 104 may be a transmission case. However the embodiments described herein are not intended to be limited to a transmission and transmission case.

The header assembly 100 has a housing 110 configured to be mounted to the electrical device 102, such as using a fastener 112. The fastener 112 may be received in a tapped hole in the case 104 or device 102. Although the illustrated embodiment shows the mounting of the header assembly 100 to the device 102 via the fastener 112 and tapped hole, numerous other mounting means are possible in other embodiments. For example, the header assembly 100 may be mounted to the device 102 via a spring clip or other fastening means.

A portion of the housing 110 may pass into or through the case 104, such as into the opening 106 to allow the wires to pass from the interior to the exterior (or from the exterior to the interior) of the device 102. The housing 110 may be sealed to the case 104, such as within the opening 106. The wires 108 may be sealed to the housing 110.

The header assembly 100 includes a wire dress cover 114 covering the wire pass-through. The wire dress cover 114 may direct the wires 108 to a particular area relative to the case 104. The wire dress cover 114 may have a low profile controlling the routing of the wires 108. Optionally, the wire dress cover 114 may force the wires 108 downward, such as toward the case 104 at the wire entrance/exit. The wire dress cover 114 may cover the entrance/exit to reduce fluid, debris or contaminants from entering the header assembly 100.

Figure 3:
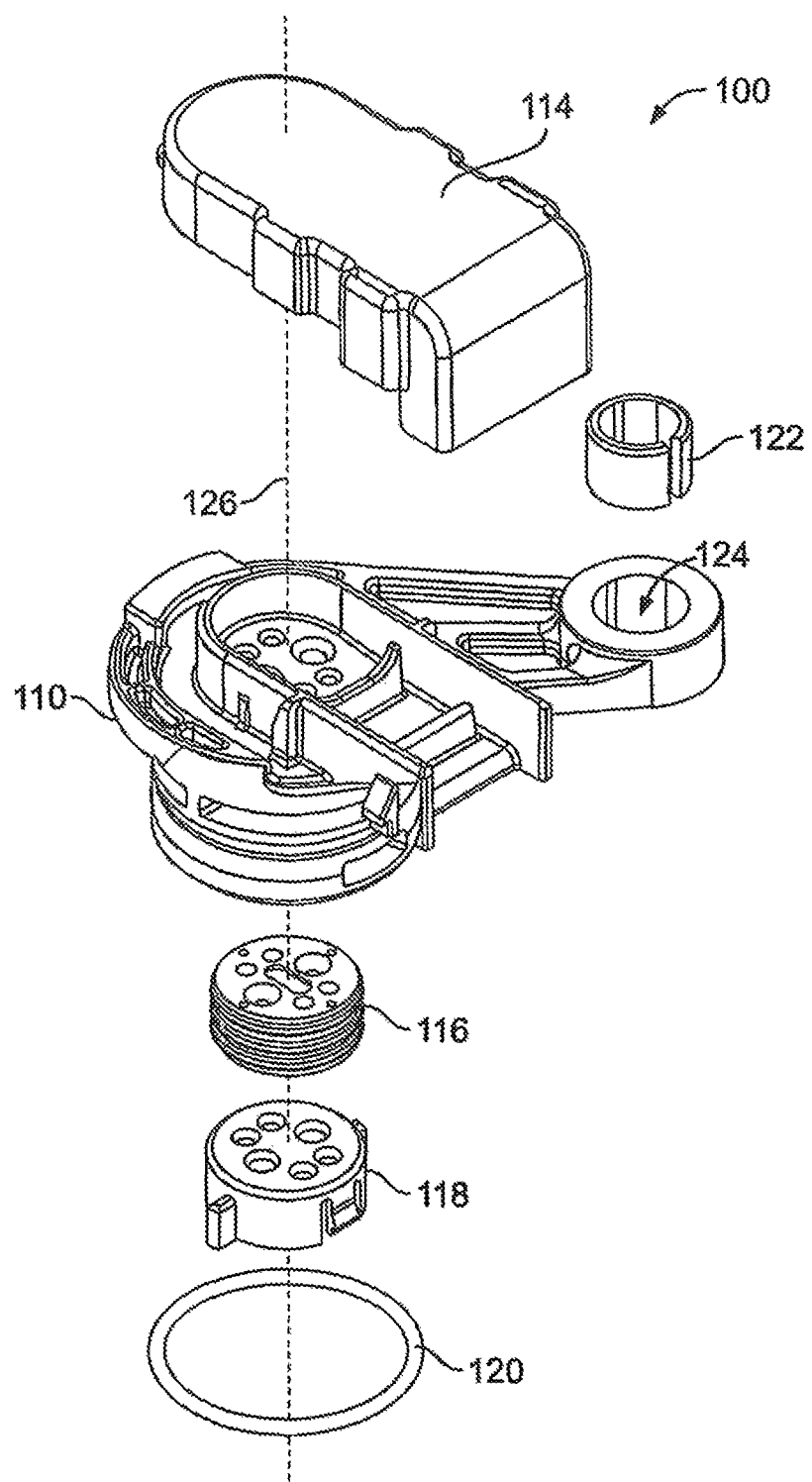
FIG. 3 is an exploded view of the sealed header assembly shown in FIG. 1.

FIG. 3 is an exploded view of the sealed header assembly 100 in accordance with an exemplary embodiment. The header assembly 100 includes the housing 110 and the wire cover 114 configured to be coupled to the housing 110 to dress and cover the wires 108 (shown in FIG. 1). The header assembly 100 includes a seal 116 and a seal cap 118 used to hold the seal 116 in the housing 110. For example, the seal 116 is inserted into the housing 110 and then the seal cap 118 is inserted into the housing 110 to hold the seal 116 in position inside the housing 110. The header assembly 100 includes an outer seal 120, such as an O-ring, for sealing to the exterior of the housing 110 and to the case 104 (shown in FIG. 1). The seal or O-ring 120 of the header assembly 100 seals the opening 106 around the header assembly 100 to avoid contaminants passing around the header assembly 100 into or out of the device 102. Optionally, the header assembly 100 includes a compression limiter 122 configured to be received in a hole 124 in the housing 110 to receive the fastener 112 (shown in FIG. 1).

In an exemplary embodiment, the various components of the header assembly 100 (for example, the housing 110, the wire cover 114, the seal 116 and the seal cap 118 may be aligned and assembled together along an axis 126, which may be a vertical axis. The header assembly 100 may be mounted to the device 102 such that the housing 110 passes partially through the opening 106 in the device 102 generally along the axis 126.

In addition to sealing the opening 106 on the device 102 which accepts the header assembly 100, the wire openings or channels within the header assembly 100 are sealed by the seal 116 to avoid passing contaminants into or out of the device 102 as the wires 108 are fed through the header assembly 100. The header assembly 100 accommodates the various wires 108 passing between the inside of the device 102 and the outside. The header assembly 100 permits the wires to pass through the header assembly 100 from the inside of the device 102 to the outside but does not permit contaminants from passing from outside the device 102 to inside the device 102 or vice versa.

The seal 116 is received in the housing 110 and the seal cap 118 is positioned below the seal 116 to hold the seal 116 in the housing 110. The wires 108 may be fed through one or more wire channels in the housing 110, the seal 116 and the seal cap 118 (for example, generally vertically parallel to the axis 126). The wires 108 are routed in a wire passageway defined between the housing 110 and the wire dress cover 114. The wire dress cover 114 directs the wires 108 between the wire channels and the wire port at the housing entrance/exit. Optionally, the wires 108 may be directed generally perpendicular (for example, generally horizontally) to the axis 126 through the wire passageway. The wires 108 may be directed generally vertically by the wire dress cover 114 at the housing entrance/exit. Such arrangement allows the header assembly 100 to take up less space and provides additional protection from contaminants.

Figure 4:
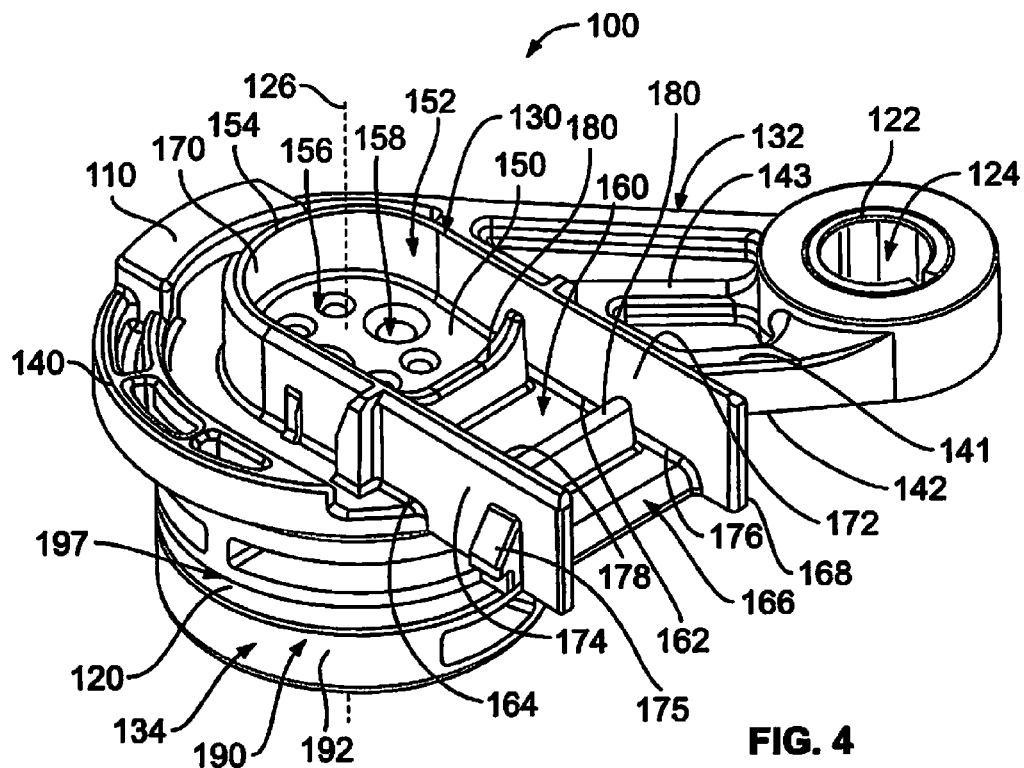
FIG. 4 is a perspective top view of a housing of a header assembly of FIG. 1.
Figure 5:
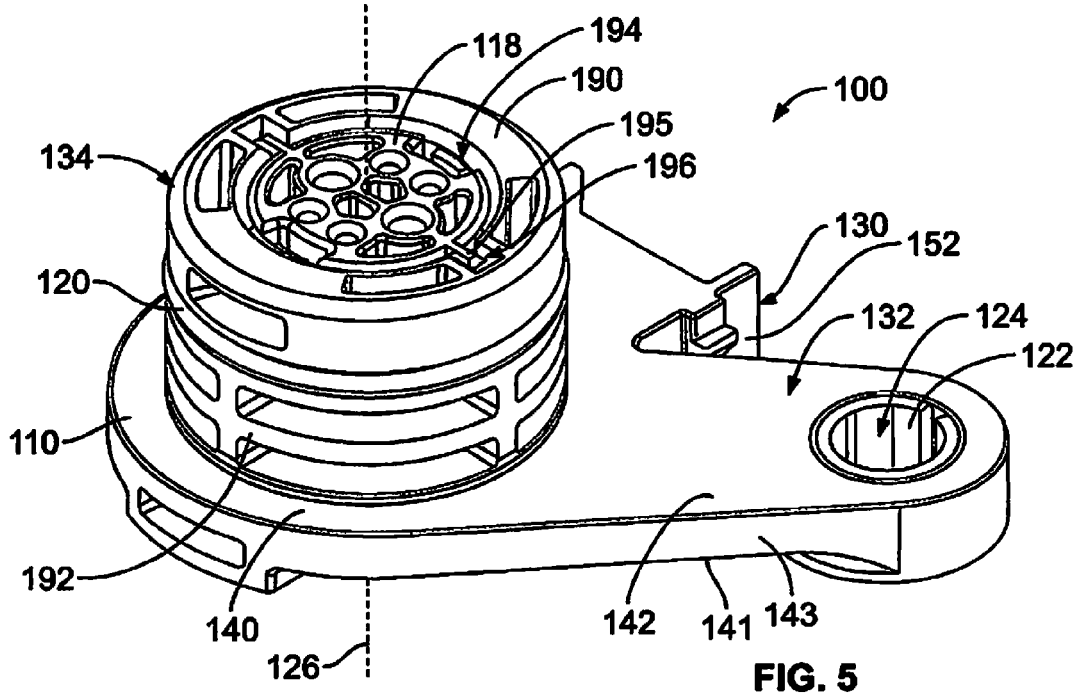
FIG. 5 is a perspective bottom view of the housing of a header assembly of FIG. 1.

FIG. 4 is a perspective top view of the housing 110 of the sealed header assembly 100. FIG. 5 is a perspective bottom view of the housing 110 of the sealed header assembly 100. As shown in FIGS. 4 and 5, the housing 110 includes a cover shroud portion 130, a mounting portion 132 and a wire holder portion 134.

The mounting portion 132 is sized and shaped to accommodate mounting to a specific case 104 of the device 102 (both shown in FIG. 1). In the exemplary embodiment, the mounting portion 132 includes a flange 140 having a top side 141 and a bottom side 142. The bottom side 142 of the flange 140 may rest directly on the case 104. The flange 140 includes an arm portion 143. The arm portion 143 includes the hole 124 that receives the compression limiter 122 and/or the fastener 112 (shown in FIG. 1). The arm portion 143 and through hole 124 are sized and located to align with the tapped hole in the case 104.

The cover shroud portion 130 includes a bottom surface 150 and a shroud 152 extending from the bottom surface 150. The bottom surface 150 may extend generally perpendicular to the vertical axis 126 and define an upward facing surface of the housing 110. A first end 154 of the bottom surface 150 may include an arched shape wire holder section 156 configured to hold the wires 108 (shown in FIG. 1). The wire holder section 156 may have a center aligned with the vertical axis 126. The housing 110 includes one or more wire channels 158 that receive the wires 108.

The bottom surface 150 includes a generally rectangular wire directing section 160 extending from the wire holder section 156. The wire directing section 160 includes a first long side 162 and second long side 164 extending to a distal end side 166 at a distal end 168 of the cover shroud portion 130 opposite the wire holder section 156. Optionally, the bottom surface 150 may be sloped in a vertical direction from a high point at the first end 154 to a lower point in a vertical direction at or near the distal end 168. The slope or angle of the bottom surface 150 prevents a buildup of fluid at the housing entrance/exit of the wires 108.

The shroud 152 of the cover shroud portion 130 extends vertically away from the bottom surface around the perimeter of the wire holder section 156 and the wire directing section 160. In the illustrated embodiment, the shroud 152 extends in a generally U-shape from the perimeter of the bottom surface 150; however the shroud 152 may have other shapes in alternative embodiments. The shroud 152 includes shroud walls including a curved end wall 170 along the wire holder section 156, a first side wall 172 along the first long side 162, and a second side wall 174 along the second long side 164. The side walls 172, 174 have latching features 175 for securing the wire cover 114 to the housing 110. The shroud walls 170, 172, 174 extend from a bottom edge 176 adjacent the bottom surface 150 to a top edge 178.

In an exemplary embodiment, one or more wire guidance features 180 extend from at or near the first side wall 172 to at or near the second side wall 174 across the wire directing section 160. The wire guidance features 180 may be ribs, tabs, protrusions, cups, saddles and the like. As will be further describe below, the wire guidance features 180 coordinate with wire guidance features on the wire cover 114 to provide guidance for and stabilization of the wires 108 within the wire passageway.

The wire holder portion 134 includes a generally cylindrical body 190 having an outer surface 192. The body 190 includes the wire channels 158 for directing the wires 108 through the wire holder portion 134. The wire holder portion 134 includes a chamber 194 that holds the seal 116 (shown in FIG. 3) and the seal cap 118. The chamber 194 may be open at the bottom to receive the seal 116 and the seal cap 118. For example, the chamber 194 may receive the seal 116 in a seal compartment of the chamber 194 and may receive the seal cap 118 in a seal cap compartment of the chamber 194. In an exemplary embodiment, the seal cap 118 includes alignment features 195 engaging alignment features 196 in the wire holder portion 134 of the housing 110 to align the seal cap 118 with the housing 110. For example, the alignment features 196 may be tabs and the alignment features 196 may be slots that receive the tabs, or vice versa. Other types of alignment features 195, 196 may be used in alternative embodiments. The body 190 includes one or more groves 197 on the outer surface 192. The groves 197 may be sized to accommodate one or more O-rings 120. Optionally, multiple grooves 197 may be provided that accommodate different sized O-rings 120, such as for sealing to differently sized openings in the case 104.

Figure 6:
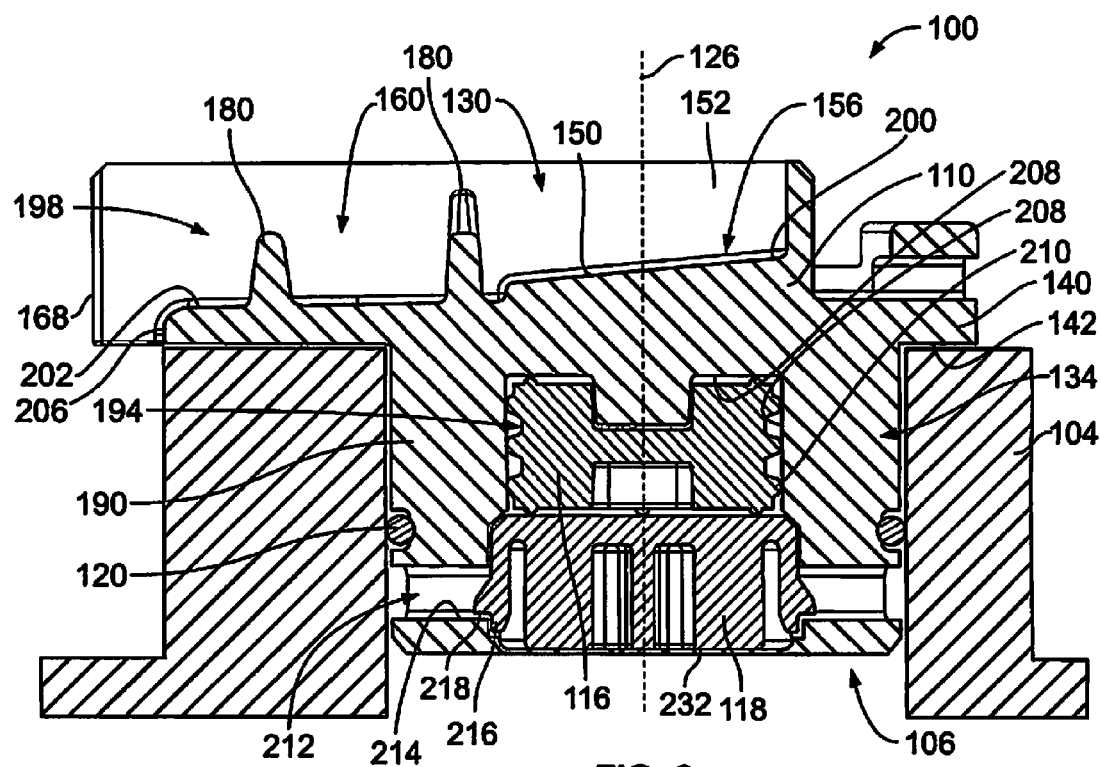
FIG. 6 is a cross-section view of a portion of the header assembly of FIG. 1.
Figure 7:
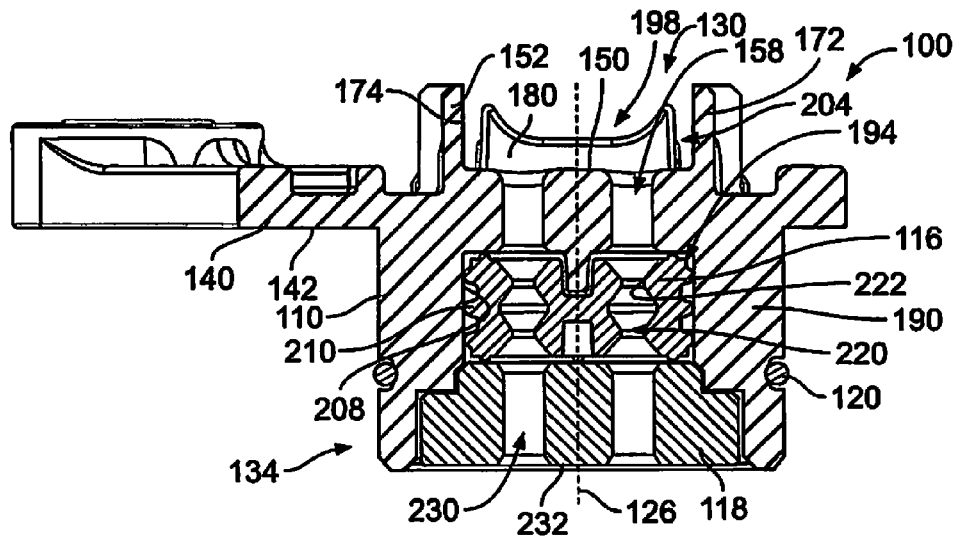
FIG. 7 is a cross-section view of a portion of the header assembly of FIG. 1.

FIGS. 6 and 7 are cross-section views of the housing 110 of the header assembly 100 with the seal 116, seal cap 118 and O-ring 120 installed. The seal 116 is installed in the seal compartment of the chamber 194 and the seal cap 118 is installed in the seal cap compartment of the chamber 194 below the seal 116. When installed on the case 104, the bottom side 142 of the flange 140 rests on the case 104 and the body 190 of the wire holder portion 134 passes into and/or through the opening 106 in the case 104. The wire holder portion 134 extends through the opening 106 in the case 104 of the electrical device 102 to an interior of the electrical device 102. The wire holder portion 134 receives the wires 108 (shown in FIG. 1) passing through the housing 110 between the interior and an exterior of the electrical device 102.

In an exemplary embodiment, a wire passageway 198 is defined by the bottom surface 150 and the shroud 152. The wires 108 are configured to be directed within the wire passageway 198 between the wire channels 158 to the housing entrance/exit. The bottom surface 150 of the cover shroud portion 130 slopes in a vertical direction from a high point 200 at the wire holder section 156 to a lower point 202 in a vertical direction at the distal end 168 of the wire directing section 160. The slope or angle of the bottom surface 150 prevents a buildup of fluid at the housing entrance/exit of the wires 108. Gaps 204 may be provided between the wire guidance features 180 and the side walls 172, 174, such as to allow any moisture buildup to drain from the wire passageway 198. Optionally, the bottom surface 150 of the wire directing section 160 includes a curved exit surface 206 at the distal end 168 to allow a smooth surface for the wires 108 at the entrance/exit.

The chamber 194 is a cylindrical cavity within the body 190 defined by or bounded by chamber walls 208, such as along the top and sides of the chamber 194. The seal 116 is installed completely within the seal compartment of the chamber 194. The seal 116 seals to one of the chamber walls 208. For example, the seal 116 may be compressible against the chamber wall 208 to provide a seal. The seal 116 may be mechanically secured in the chamber 194 by an interference or compression fit. The seal 116 may include one or more seal flanges 210 that engage the chamber wall 208. The seal 116 may be manufactured from a material capable of providing mechanical sealing to prevent contaminants and/or fluids from passing therethrough, such as a rubber material. The seal 116 may be a gasket.

The seal cap 118 is sized and shaped to fit in the chamber 194 below the seal 116. In an exemplary embodiment, the body 190 includes slots 212 open to the chamber 194. The slots 212 include locking surfaces 214, such as at the bottom of the slots 212. The locking surfaces 214 provide a shelf to lock mounting legs 216 of the seal cap 118 into the seal cap compartment of the chamber 194. Each mounting leg 216 includes a mounting ledge 218 extending outward from the mounting leg 216. The mounting ledge 218 locks onto the locking surface 214 to lock the seal cap 118 into the housing 110. Upon locking the seal cap 118 into the chamber 194, the seal 116 is locked within the seal compartment of the chamber 194 to further lock the seal 116 within the body 190 of the wire holder portion 134 of the housing 110.

In an exemplary embodiment, the seal 116 includes one or more wire channels 220 therethrough. Optionally, the seal 116 may include different sized wire channels 220 for receiving different sized wires 108, but alternative embodiments may have various numbers of wire channels 220 in various sizes. The seal 116 is configured to seal against the wires 108 passing through the wire channels 220. For example, the seal 116 may include seal flanges 222 that engage the wires 108 to seal against the wires 108. The seal 116 may be compressible by the wires 108 to provide sealing therebetween.

The seal cap 118 includes one or more wire channels 230 therethrough. The wire channels 230 may be of different sizes for different wires sizes. The wire channels 230 are sized to closely fit with the respective wire size to provide strain relief on the wires 108, which may remove stress from the seal 116 if the wires 108, from below the header assembly 100, are bent. The wire channels 230 are aligned with the wire channels 220 of the seal 116 parallel to the vertical axis 126. Any bending or movement of the wires 108 may be relieved at a bottom end 232 of the seal cap 118 to prevent lateral movement of the wires 108 within the wire channels 220 of the seal 116. As such, the sealed engagement between the wires 108 and the seal 116 is not compromised.

The body 190 includes the wire channels 158 that align with the wire channels 220 in the seal 116 parallel to the vertical axis 126. The wire channels 158 pass through the chamber wall 208 at the top of the chamber 194. The wire channels 158 are open to the chamber 194 and to the cover shroud portion 130 on opposite sides of the upper chamber wall 208. Like the wire channels 230 in the seal cap 118, the wire channels 158 in the body 190 are sized as a close fit to the diameter of the associated wire 108 to provide wire strain relief to remove stress from the seal 116 as the wires 108 are moved or bent within the wire passageway 198. Any bending or movement of the wires 108 may be relieved at a bottom surface 150 at the entrance/exit of the wire channels 158 to prevent lateral movement of the wires 108 within the wire channels 220 of the seal 116. As such, the sealed engagement between the wires 108 and the seal 116 is not compromised. The wire channels 158, 220, 230 of the wire holder portion 134, the seal 116, and the seal cap 118 are aligned to create paths for the wires 108 to pass through the housing 110.

Figure 8:
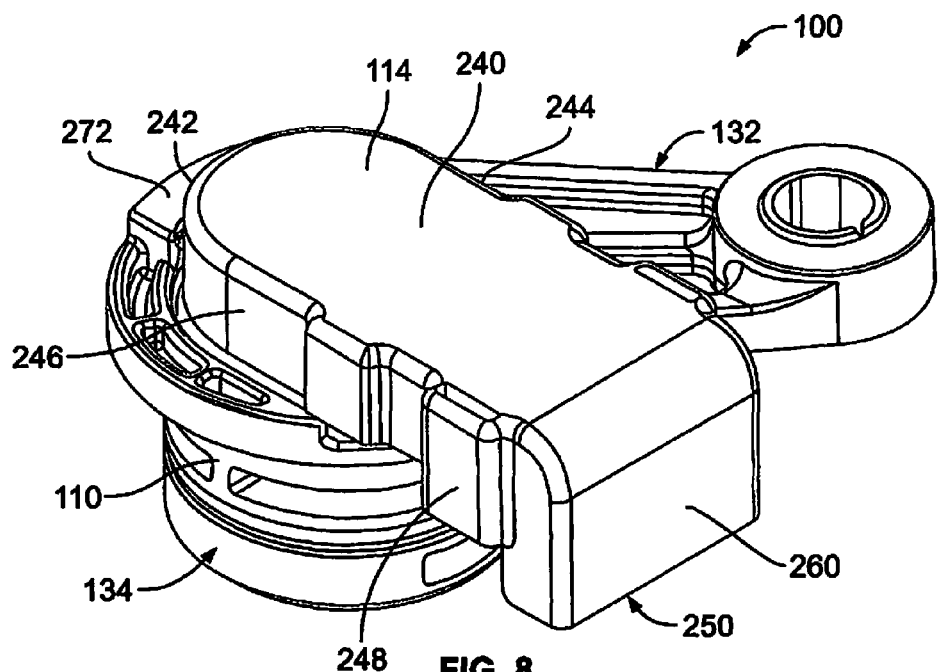
FIG. 8 is a perspective top view of the header assembly of FIG. 1.
Figure 9:
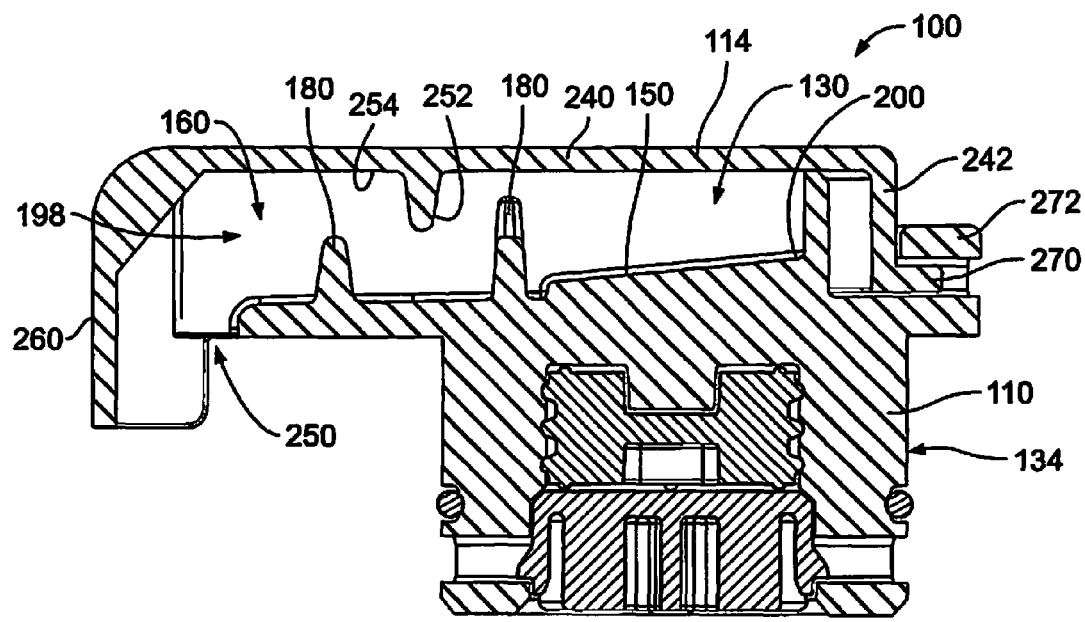
FIG. 9 is a cross-section view of the header assembly of FIG. 1.

FIG. 8 is a perspective top view of the header assembly 100. FIG. 9 is a cross-sectional view of the header assembly 100. The wire cover 114 is shown coupled to the housing 110. The wire cover 114 includes a top plate 240, a front end wall 242 and side walls 244, 246 extending from the top plate 240. The wire cover 114 contains the wires 108 in the wire passageway 198 below the top plate 240. The wires 108 may exit at the distal end of the wire cover 114. When installed over the cover shroud portion 130 of the housing 110, the cover side walls 244, 246 align and lock with the side walls 172, 174 (shown in FIG. 4) of the cover shroud portion 130. Latching features 248 on the cover side walls 244, 246 lock with corresponding latching features 175 (shown in FIG. 4) on the side walls 172, 174.

The wire cover 114 extends over the cover shroud portion 130 of the housing 110 creating the wire passageway 198 and a wire port 250 at the wire entrance/exit between the wire cover 114 and the housing 110. In the illustrated embodiment, the wire port 250 is downward facing to reduce contaminant or fluid infiltration into the header assembly 100. Optionally, the wire port 250 may be positioned below the high point 200. The bottom surface 150 may be sloped downward from the wire channels 158 of the wire holder portion 134 to the wire port 250 where the wires 108 enter or exit the sealed header assembly 100. The wire port 250 may be positioned below the wire channels 158 in the wire holder portion 134. As such, the wires 108, at the wire entrance/exit is provided close to the case 104 (shown in FIG. 1) to maintain a low profile.

The cover 114 may include one or more wire guidance features 252 from a top inner surface 254 of the top plate 240. In the exemplary embodiment, the wire guidance feature 252 is a rib located at a position along the length of the cover 114 such that it extends into the wire passageway 198 between the wire guidance features 180 of the wire directing section 160 of the housing 110. As such, the wire guidance features 180, 252 cause the wires 108 to follow a tortuous path through the wire passageway 198. For example, as shown in FIG. 9, in an exemplary embodiment, the path of the wires 108 would pass over the first wire guidance feature 180, under the wire guidance feature 252 and over the distal wire guidance feature 180 creating a serpentine path for the wires 108 exiting the housing 110 of the header assembly 100. The serpentine path provides tension to help retain the wires 108 to reduce the pull back and forth on the wires 108.

In an exemplary embodiment, the cover 114 may include an end section 260, which directs the wires 108 in a downward direction. For example, the wires 108 may be directed 90° back toward the case through the wire port 250. Alternate embodiments may have the end section 260 that direct the wires in alternative directions.

The cover 114 includes a latching feature 270 adjacent the front end wall 242 of the cover 114. The latching feature 270 is mated with a corresponding latching feature 272 of the mounting portion 132 of the housing 110. For example, the latching feature 270 may be a tab and the latching feature 272 may be a slot that receives the tab. The latching feature 272 prevents lift-off of the cover 114 from the housing 110.

Figure 10:
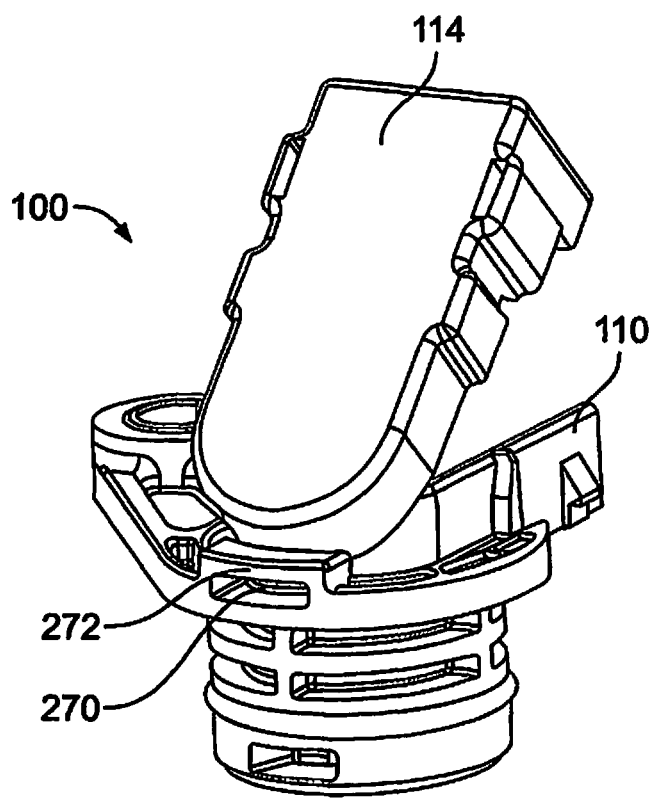
FIG. 10 is a perspective view of the header assembly showing a cover being installing onto the housing of the header assembly of FIG. 1.

FIG. 10 is a perspective view of the header assembly 100 showing the cover 114 being coupled to the housing 110. Optionally, the cover 114 may be installed at an angle relative to the housing 110 of the header assembly 100. The cover 114 is rotated towards the housing 110 so that the latching features 270 of the cover 114 interlocks with the latching features 272 of the housing 110.

Figure 11:
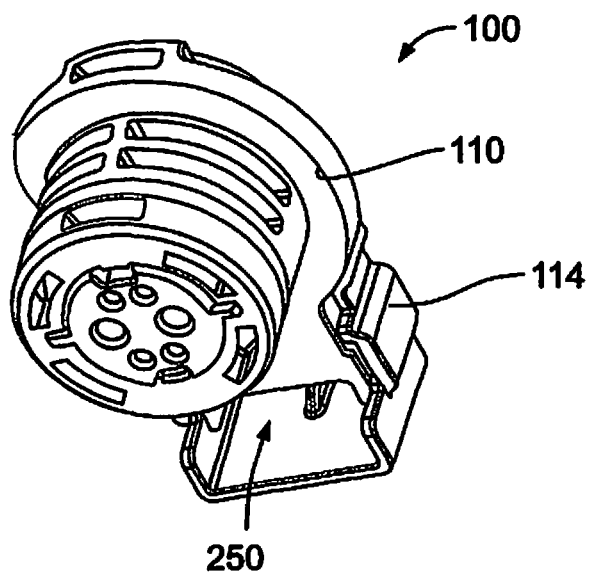
FIG. 11 is a perspective bottom view of the header assembly of FIG. 1.

FIG. 11 is a perspective bottom view of a header assembly 100. As shown in FIG. 11 the header assembly 100 provides a compact sealed pass through that does not require a potted or sealed header or an over molded grommet. The header assembly 100 provides the wire dress cover 114 that reduces the size or height profile while providing strain relief and reduced stress on the wires. The sealed header assembly 100 uses the rigid pass-through housing 110 with integral wire stabilizer, wire seals and housing seals that also allows for a very low profile right angle wire exit port 250 without additional mating connectors and associated mating interfaces.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A sealed header assembly comprising:
a housing having a cover shroud portion, a mounting portion and a wire holder portion, the mounting portion configured to mount the housing to a case of an electrical device, the wire holder portion configured to extend through an opening in the electrical device to an interior of the electrical device, the wire holder portion configured to receive wires passing through the housing between the interior and an exterior of the electrical device, the wire holder portion including a chamber bounded by chamber walls, the wire holder portion having one or more wire channels through one of the chamber walls being open to the chamber and to the cover shroud portion on opposite sides of the chamber wall, an exterior of the wire holder portion having a seal configured to be sealed to the case of the electrical device;
a wire cover removably mounted to the housing at the cover shroud portion to define a wire passageway for the wires;
a seal received in the chamber and being sealed to at least one of the chamber walls, the seal having one or more wire channels and configured to seal against the wires received in the corresponding wire channels; and
a seal cap received in the chamber to hold the seal in the chamber, the seal cap including one or more wire channels receiving corresponding wires, wherein the wire channels of the seal cap are aligned with the wire channels of the seal to direct the wires along corresponding wire channel axes through the seal.

2. The sealed header assembly of claim 1, wherein the wire channels in the seal cap prevent lateral movement of the wires within the wire channels of the seal and wherein the wire channels in the wire holder portion prevent lateral movement of the wires within the wire channels of the seal.

3. The sealed header assembly of claim 1, wherein the wire channels of the wire holder portion, the wire channels of the seal, and the wire channels of the seal cap are aligned to create paths for the wires to pass through the housing.

4. The sealed header assembly of claim 1, wherein the wire channels are oriented generally vertically and the wire passageway is oriented generally horizontally.

5. The sealed header assembly of claim 1, wherein the cover shroud portion includes a wire guidance feature and the wire cover includes a wire guidance feature coordinating with the wire guidance feature of the cover shroud portion to cause the wires to follow a tortuous path through the wire passageway.

6. The sealed header assembly of claim 1, wherein the cover shroud portion includes a bottom surface and side walls extending above the bottom surface to a top edge, the wire cover including a top plate above the top edge, the wire cover containing the wires in the wire passageway below the top plate.

7. The sealed header assembly of claim 1, wherein the seal cap includes mounting legs engaging the housing to lock the seal in the chamber.

8. The sealed header assembly of claim 1, wherein the seal cap includes alignment features engaging alignment features in the wire holder portion of the housing to align the seal cap with the housing.

9. The sealed header assembly of claim 1, wherein the seal includes seal flanges sealing to the corresponding chamber wall.

10. The sealed header assembly of claim 1, wherein the seal includes seal flanges within the wire channels sealing to the corresponding wires.

11. The sealed header assembly of claim 1, wherein the cover shroud portion includes a bottom surface, the bottom surface being sloped downward from the wire channels of the wire holder portion to a wire port where the wires enter or exit the sealed header assembly.

12. The sealed header assembly of claim 1, wherein the cover shroud portion includes a bottom surface and shroud walls extending above the bottom surface, the shroud walls and the bottom surface defining the wire passageway with the wire cover covering the wire passageway.

13. A sealed header assembly comprising:
a housing having a cover shroud portion, a mounting portion and a wire holder portion, the mounting portion configured to mount the housing to a case of an electrical device, the wire holder portion configured to extend through an opening in the electrical device to an interior of the electrical device, the wire holder portion configured to receive wires passing through the housing between the interior and an exterior of the electrical device, the wire holder portion including a chamber bounded by chamber walls, the wire holder portion having one or more wire channels through one of the chamber walls being open to the chamber and to the cover shroud portion on opposite sides of the chamber wall, an exterior of the wire holder portion having a seal configured to be sealed to the case of the electrical device;
a wire cover removably mounted to the housing at the cover shroud portion to define a wire passageway for the wires, wherein the wire cover directs the wires through the wire passageway to a wire port;
a seal received in the chamber and being sealed to at least one of the chamber walls, the seal having one or more wire channels and configured to seal against the wires received in the corresponding wire channels; and
a seal cap received in the chamber to hold the seal in the chamber, the seal cap including one or more wire channels receiving corresponding wires.

14. The sealed header assembly of claim 13, wherein the wire port is downward facing.

15. The sealed header assembly of claim 13, wherein the wire port is below the wire channels in the chamber wall of the wire holder portion.

16. The sealed header assembly of claim 13, wherein the wire channels of the seal cap are aligned with the wire channels of the seal to direct the wires along corresponding wire channel axes through the seal.

17. A sealed header assembly comprising:
a housing having a cover shroud portion, a mounting portion and a wire holder portion;
the mounting portion configured to mount the housing to a case of an electrical device;
the wire holder portion configured to extend through and seal to an opening in the electrical device to an interior of the electrical device, the wire holder portion having a seal configured to receive and seal wires passing through the housing between the interior and an exterior of the electrical device, the wire holder portion having wire channels receiving the wires, the wire channels extending along channel axes;

the cover shroud portion having a bottom surface and shroud walls extending from the bottom surface to a top edge; and a wire cover removably mounted to the housing at the top edge of the cover shroud portion to define a wire passageway for the wires between the bottom surface and the wire cover, wherein the cover directs the wires through the wire passageway between a wire port and the wire channels in a direction generally perpendicular to the channel axes.

18. The sealed header assembly of claim 17, wherein the wire channels prevent lateral movement of the wires within the seal.

19. The sealed header assembly of claim 17, wherein the cover shroud portion includes a wire guidance feature and the wire cover includes a wire guide feature coordinating with the wire guide feature of the cover shroud portion to cause the wires to follow a tortuous path through the wire passageway.

20. The sealed header assembly of claim 17, further comprising a seal cap received in the wire holder portion to hold the seal in the wire holder portion, the seal cap includes a plurality of wire channels receiving corresponding wires.

\* \* \* \* \*